US006989290B2

(12) United States Patent
Aviram (10) Patent No.: US 6,989,290 B2
(45) Date of Patent: Jan. 24, 2006

(54) ELECTRICAL CONTACTS FOR MOLECULAR ELECTRONIC TRANSISTORS

(76) Inventor: Ari Aviram, 444 Bramblebush Rd., Croton On Hudson, NY (US) 10520

( * ) Notice: Subject to any disclaimer, the term of this patent is extended or adjusted under 35 U.S.C. 154(b) by 47 days.

(21) Appl. No.: 10/714,083

(22) Filed: Nov. 15, 2003

(65) Prior Publication Data
US 2005/0106804 A1    May 19, 2005

(51) Int. Cl.
H01L 51/40    (2006.01)
(52) U.S. Cl. .......................... 438/99; 438/586; 257/40
(58) Field of Classification Search ............... 438/99, 438/584, 586
See application file for complete search history.

(56) References Cited

U.S. PATENT DOCUMENTS

| 3,953,874 | A | * | 4/1976 | Aviram et al. ............. 257/40 |
| 4,690,715 | A | | 9/1987 | Allara et al. ............. 148/252 |
| 4,912,531 | A | | 3/1990 | Reed et al. ............. 357/12 |
| 5,017,975 | A | | 5/1991 | Ogawa ............. 257/40 |
| 5,034,192 | A | | 7/1991 | Wrighton et al. ........ 422/82.02 |
| 5,487,792 | A | | 1/1996 | King et al. ............. 136/256 |
| 5,536,573 | A | | 7/1996 | Rubner et al. ............. 428/378 |
| 5,879,973 | A | | 3/1999 | Yanai et al. ............. 438/161 |
| 6,091,267 | A | | 7/2000 | Palm et al. ............. 326/136 |
| 6,259,277 | B1 | | 7/2001 | Tour et al. ............. 326/136 |
| 6,320,200 | B1 | | 11/2001 | Reed et al. ............. 257/40 |
| 6,339,227 | B1 | | 1/2002 | Ellenbogen ............. 257/40 |
| 6,430,511 | B1 | | 8/2002 | Tour et al. ............. 702/19 |
| 6,433,359 | B1 | * | 8/2002 | Kelley et al. ............. 257/40 |
| 6,482,639 | B2 | | 11/2002 | Snow et al. ............. 435/287.2 |
| 6,492,096 | B1 | | 12/2002 | Liu et al. ............. 430/324 |
| 6,518,168 | B1 | | 2/2003 | Clem et al. ............. 438/623 |
| 6,847,048 | B2 | * | 1/2005 | Yan et al. ............. 257/40 |
| 6,949,762 | B2 | * | 9/2005 | Ong et al. ............. 257/40 |
| 2004/0012018 | A1 | * | 1/2004 | Tanabe ............. 257/40 |
| 2004/0245550 | A1 | * | 12/2004 | Afzali-Ardakani et al. ............. 257/221 |
| 2005/0101063 | A1 | * | 5/2005 | Tour et al. ............. 438/142 |

OTHER PUBLICATIONS

Aviram, A., "Molecules for Memory, Logic, and Amplification," *J. Am. Chem. Soc.,* 110: 5687-5692 (1998).
Aviram, A., "A View of the Future of Molecular Electronics," *Molecular Crystals and Liquid Crystals,* 234: 13-28 (1993).
DiVentra, M., et al., "The benzene molecule as a molecular resonant-tunneling transistor," *Applied Physics Letters, 76:* 3448-3450 (2000).
Nuzzo, R.G. and Allara, D. L., "Adsorption of Bifunctional Organic Disulfides on Gold Surfaces," *J.Am.Chem.Soc., 105:* 4481-4483 (1983).
Allara, D. L., et al., "Evolution of Strategies for Self-Assembly and Hookup of Molecule-Based Devices," *Annals New York Academy of Sciences, 852:* 349-370 (1983).
Reed, M.A., et al., *Science,* "Conductance of a Molecular Junction," 278: 252-253 (1997).

(Continued)

*Primary Examiner*—W. David Coleman
(74) *Attorney, Agent, or Firm*—Arendt & Associates Intellectual Property Group; Jacqueline Arendt (57) ABSTRACT

Electronic circuits based on molecular transistors, generally used in place of semiconductors. More particularly, the invention relates to a unique method of wiring of a three-terminal molecule (or an aggregate thereof) to serve as an electronic transistor, containing a gate electrode, a source electrode, and a drain electrode. The source electrode and drain electrode are fabricated from one metal and the gate electrode is fabricated from another metal. The usage of molecular properties in this context provides significant advantages over the fabrication methods of the prior art.

21 Claims, 5 Drawing Sheets

OTHER PUBLICATIONS

Aviram, A., *International Journal of Quantum Chemistry*, "A Strategic Plan for Molecular Electronics," 42: 1615-1624 (1992).

Carroll, R. Lloyd and Gorman, Christopher B., *Angew. Chem.Int.Ed.*, The Genesis of Molecular Electronics, 41: 4378-4400 (2002).

* cited by examiner

ELECTRICAL CONTACTS FOR MOLECULAR ELECTRONIC TRANSISTORS

BACKGROUND OF THE INVENTION

1. Field of the Invention

The present invention relates to electronic circuits based on molecular transistors, generally used in place of semiconductors. More particularly, the invention relates to a unique method of wiring of a three-terminal molecule (or an aggregate thereof) to serve as an electronic transistor, containing a gate electrode, a source electrode, and a drain electrode. The source electrode and drain electrode are fabricated from one metal and the gate electrode is fabricated from another metal. The usage of molecular properties in this context provides significant advantages over the fabrication methods of the prior art.

2. Description of the Prior Art

Numerous innovations for electronic circuits have been provided in the prior art that are described as follows. Although these innovations may be suitable for the specific individual purposes to which they address, they differ from the present invention as hereinafter contrasted. The following is a summary of those prior art patents most relevant to the invention at hand, as well a description outlining the differences between the features of the present invention and those of the prior art.

1. U.S. Pat. No. 6,339,227, Invented by Ellenbogen, Entitled "Monomolecular Electronic Device"

In the patent to Ellenbogen, a monomolecular electronic device is provided which includes a molecular diode having at least one barrier insulating group chemically bonded between a pair of molecular ring structures to form a pair of diode sections, at least one dopant group chemically bonded to one of the pair of diode sections, and a molecular gate structure chemically bonded to the one diode section for influencing an intrinsic bias formed by the at least one dopant group. The device thus produced operates as a molecular electronic transistor, exhibiting both switching and power gain. By adding yet another insulating group to the other of the diode sections, an electrical resistance is formed to define an output which represents an inverter or NOT gate function. The NOT gate can be chemically bonded to molecular diode-diode logic structures to form a single molecule that exhibits complex Boolean functions and power gain.

2. U.S. Pat. No. 4,912,531, Invented by Reed et al., Entitled "Three-Terminal Quantum Device"

The patent to Reed et al. descries a three-terminal quantum well device, which functions somewhat analogously to an MOS transistor. That is, the three terminals of the device can generally be considered as source, gate, and drain. An output contact is connected by tunneling to a number of parallel chains of quantum wells, each well being small enough that the energy levels in the well are quantized discretely. In each of these chains of wells, the second well is coupled to a common second conductor, and the first well is electronically coupled to a common first conductor.

3. U.S. Pat. No. 6,259,277, Invented by Tour, et al., Entitled "Use Of Molecular Electrostatic Potential To Process Electronic Signals"

The Tour et al. invention is a design paradigm for molecular scale electronic systems wherein electronic information is transmitted and processed, and electronic logic is obtained by changing the electrostatic potential of a molecule. The signal may be restored using an external potential through the underlying substrate. Several convergent synthetic routes are shown to conjugated molecules with various potential electronic device applications including a two-terminal molecular wire with a transport barrier, a molecular wire with two transport barriers, three-terminal junctions, three-terminal structures with switch-like possibilities, and four-terminal systems that could serve as logical gates without the use of multiple transistors. Ab initio computational methods are used to show that molecules can be considered active electronic devices able to transfer the information from one molecule to another, the electrostatic potential can also be used as a tool to perform logical operations, and that the molecules synthesized here could perform the functions for which they were designed.

4. U.S. Pat. No. 5,879,973, Invented by Yanai et al., Entitled "Method For Fabricating Thin-Film Transistor"

To form a contact layer on source and drain electrodes of a stagger-type TFT, a conductive material is selectively sticked to the surface of the source and drain electrodes and a contact layer is selectively deposited by using the conductive material as growth species to form an active semiconductor layer on the contact layer. For an inverted-stagger-type TFT, a conductive material is selectively deposited on the surface of a contact layer to use the selectively deposited conductive material as source and drain electrodes so that patterning is unnecessary. To selectively deposit a contact layer of a TFT by alternately repeating etching and deposition, the temperature for the etching is set to 200.degree. C. or lower. A contaminated layer on the surface of a semiconductor film serving as an active semiconductor layer and contact layer of a TFT is removed by plasma at the temperature of 200.degree. C. or lower. For a stagger-type thin-film transistor, the hydrogen or halogen content of an insulating film serving as the substrate of source and drain electrodes is increased. For an inverted-stagger thin-film transistor, the hydrogen or halogen content of an insulating film serving as a channel protective film is increased. Thus, the etching rate of the surfaces of these insulating films by plasma increases.

5. U.S. Pat. No. 6,320,200, Invented by Reed et al., Entitled "Sub-Nanoscale Electronic Devices And Processes"

The patent to Reed et al. describes an integrated circuit structure including a plurality of transistors; a plurality of thin-film conductor interconnects, interconnected to form electronic circuits in a predetermined electrical configuration; and a plurality of pairs of contact pads, connected to the thin-film conductor interconnects, each adjacent pair of contact pads including a first pad of a first conductive material and a second pad of a second conductive material, and being electrically connected only by a conductive oligomer of a precisely determined number of units.

6. U.S. Pat. No. 6,091,267, Invented by Palm et al., Entitled "Logic Circuits"

The patent to Palm et al. describes a logic circuit having at least a first input terminal and at least a first output terminal, comprises at least a first and a second electron-wave Y-branch switch, each having a source, a first drain, a second drain, and at least a first gate for switching a source current between the first and the second drain. The sources of said first and second Y-branch switches are adapted to be connected to a high voltage supply and a low voltage supply, respectively. The first gates of said first and second Y-branch switches are interconnected, and the interconnection point between said first gates constitutes said first input terminal.

The first drain of the first Y-branch switch is connected to the second drain of the second Y-branch switch, and the second drain of the first Y-branch switch is connected to the first drain of the second Y-branch switch. The interconnection point between said second drain of the first Y-branch switch and said first drain of the second Y-branch switch constitutes said first output terminal.

7. U.S. Pat. No. 6,430,511, Invented by Tour et al., Entitled "Molecular Computer"

In the patent to Tour et al., a molecular computer is formed by establishing arrays of spaced-apart input and output pins on opposing sides of a containment, injecting moleware in solution into the containment and then allowing the moleware to bridge the input and output pins. Moleware includes molecular alligator clip-bearing 2-, 3-, and molecular 4-, or multi-terminal wires, carbon nanotube wires, molecular resonant tunneling diodes, molecular switches, molecular controllers that can be modulated via external electrical or magnetic fields, massive interconnect stations based on single nanometer-sized particles, and dynamic and static random access memory (DRAM and SRAM) components composed of molecular controller/nanoparticle or fullerene hybrids. The current-voltage characteristics that result from the bridging between input and output arrays can be ascertained using another computer to identify the bundles of inputs and corresponding outputs that provide a truth table for the specific functions of the computer.

8. U.S. Pat. No. 6,518,168, Invented by Clem et al., Entitled "Self-Assembled Monolayer Directed Patterning Of Surfaces"

The patent to Clem et al. describes a technique for creating patterns of material deposited on a surface involves forming a self-assembled monolayer in a pattern on the surface and depositing, via chemical vapor deposition or via sol-gel processing, a material on the surface in a pattern complementary to the self-assembled monolayer pattern. The material can be a metal, metal oxide, or the like. The surface can be contoured, including trenches or holes, the trenches or holes remaining free of self-assembled monolayer while the remainder of the surface is coated. When exposed to deposition conditions, metal or metal oxide is deposited in the trenches or holes, and remaining portions of the article surface remain free of deposition. The technique finds particular use in creation of conductive metal pathways selectively within holes passing from one side of a substrate to another.

9. U.S. Pat. No. 5,487,792, Invented by King et al., Entitled "Molecular Assemblies As Protective Barriers And Adhesion Promotion Interlayer"

In the patent to King et al., a protective diffusion barrier having adhesive qualifies for metalized surfaces is provided by a passivating agent having the formula HS—(CH.sub.2).sub.11—COOH Which forms a very dense, transparent organized molecular assembly or layer that is impervious to water, alkali, and other impurities and corrosive substances that typically attack metal surfaces.

10. U.S. Pat. No. 4,690,715, Invented by Allara et al., Entitled "Modification Of the Properties Of Metals"

The use of modifiers such as disulfides and phosphines is particularly effective in modifying the properties of metals such as noble metals and silver. For example, disulfides are useful for modifying the properties of gold and silver while phosphines are useful for metals such as platinum and palladium. Through treatment with a suitable modifier it is possible to change properties such as the wetting and adhesion properties of the treated metal. Additionally, the use of modifiers to treat a desired substrate enhances formation of continuous metal films on this substrate.

11. U.S. Pat. No. 5,034,192, Invented by Wrighton et al., Entitled "Molecule-Based Microelectronic Devices"

In the patent to Wrighton et al., several types of new microelectronic devices including diodes, transistors, sensors, surface energy storage elements, and light-emitting devices are disclosed. The properties of these devices can be controlled by molecular-level changes in electroactive polymer components. These polymer components are formed from electrochemically polymerizable material whose physical properties change in response to chemical changes, and can be used to bring about an electrical connection between two or more closely spaced microelectrodes. Examples of such materials include polypyrrole, polyaniline, and polythiophene, which respond to changes in redox potential. Each electrode can be individually addressed and characterized electrochemically by controlling the amount and chemical composition of the functionalizing polymer. Sensitivity of the devices may be increased by decreasing separations between electrodes as well as altering the chemical environment of the electrode-confined polymer. These very small, specific, sensitive devices provide means for interfacing electrical and chemical systems while consuming very little power.

12. U.S. Pat. No. 5,017,975, Invented by Ogawa, Entitled "Organic Electronic Device With A Monomolecular Layer Or Multi-Monomolecular Layer Having Electroconductive Conjugated Bonds"

The Ogawa invention provides an organic electronic device characterized by comprising a monomolecular or built-up multi-monomolecular layer having an insulating layer and an electroconductive conjugated bonds disposed between a first electrode and both a second and a third electrodes formed on a substrate, said device being operated by applying an voltage between said first electrode and said second electrode or said third electrode as well as between said second electrode and said third electrode, varying the voltage between said first electrode and said second electrode or said third electrode to control the electroconductivity of said electroconductive conjugated bonds via said insulating layer, whereby an electric current flowing across said electroconductive conjugated bonds between said second electrode and said third electrode is controlled, where said monomolecular layer is produced by utilizing the LB method or a chemical adsorption technique.

13. U.S. Pat. No. 6,482,639, Invented by Snow et al., Entitled "Microelectronic Device And Method For Label-Free Detection And Quantification Of Biological And Chemical Molecules"

The patent to Snow et al. describes a molecular recognition-based electronic sensor, which is a gateless, depletion mode field effect transistor consisting of source and drain diffusions, a depletion-mode implant, and insulating layer chemically modified by immobilized molecular receptors that enables miniaturized label-free molecular detection amenable to high-density array formats. The conductivity of the active channel modulates current flow through the active channel when a voltage is applied between the source and drain diffusions. The conductivity of the active channel is determined by the potential of the sample solution in which the device is immersed and the device-solution interfacial capacitance. The conductivity of the active channel modulates current flow through the active channel when a voltage is applied between the source and drain diffusions. The interfacial capacitance is determined by the extent of occupancy of the immobilized receptor molecules by target molecules. Target molecules can be either charged or uncharged. Change in interfacial capacitance upon target molecule binding results in modulation of an externally supplied current through the channel.

14. U.S. Pat. No. 5,536,573, Invented by Rubner et al., Entitled "Molecular Self-Assembly Of Electrically Conductive Polymers"

In the patent to Rubner et al., a thin-film heterostructure bilayer is formed on a substrate by a molecular self-assembly process based on the alternating deposition of a p-type doped electrically conductive polycationic polymer and a conjugated or nonconjugated polyanion or water soluble, non-ionic polymer has been developed. In this process, monolayers of electrically conductive polymers are spontaneously adsorbed onto a substrate from dilute solutions and subsequently built-up into multilayer thin films by alternating deposition with a soluble polyanion or water soluble, non-ionic polymer. In contrast to a deposition process involving the alternate self-assembly of polycations and polyanions, this process is driven by non-covalent bonded attractions (for example, ionic and hydrogen bonds) developed between a p-type doped conducting polymer and a polymer capable of forming strong secondary bonds. The net positive charge of the conducting polymer can be systematically adjusted by simply varying its doping level. Thus, with suitable choice of doping agent, doping level and solvent, it is possible to manipulate a wide variety of conducting polymers into uniform multilayer thin films with layer thicknesses ranging from a single monolayer to multiple layers.

15. U.S. Pat. No. 6,492,096, Invented by Liu et al., Entitled "Patterned Molecular Self Assembly"

In the patent to Liu et al., a patterned molecular self-assembly is provided. The patterned molecular self-assembly comprises a support having an exposed patterned surface and a non-patterned surface. A compound is selectively adsorbed on the exposed patterned surface. The compound may comprise a first compound selectively adsorbed on the exposed patterned surface and a second compound selectively adsorbed on the first compound to form at least one bilayer. The patterned molecular self-assembly may further comprise a first set of bilayers and a second set of bilayers wherein the first set of bilayers has a different composition than the second set of bilayers.

Generally, with regard to all prior art, the act of further miniaturizing devices via conventional semiconductor fabrication has become increasingly difficult, with associated rising costs therewith. Thus, two types of molecular transistors have been described in the prior art as alternatives to semiconductor fabrication.

The first type of molecular transistor is based on a double-well potential molecule, which contains two elongated chains placed next to one another perpendicularly. Such is illustrated in FIG. 1, which shows the molecule without the connecting electrodes.

Figure 1:
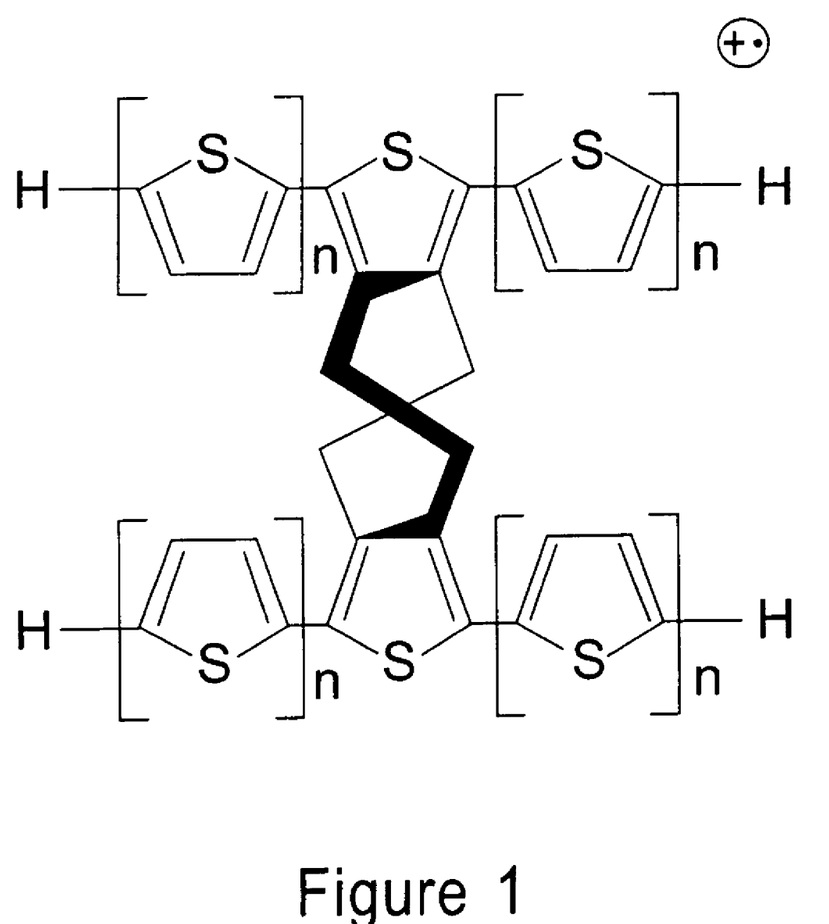
FIG. 1 depicts a molecular transistor based on the mixed-valence model described in Reference 1. The figure does not show the electrode connections.

In this instance of FIG. 1, one of the chains lacks an electron and is conductive, while the other chain is insulating. By application of a perpendicular electric field, it is then possible to switch the position of the electron hole to the insulating chain, thus rendering it conductive. [See A. Aviram, *Journal of the American Chemical Society*, 1998, 110, 5687.] This process is equivalent to switching the conductivity of a field-effect transistor. A planar configuration for this device is shown in FIG. 2, which again shows the molecule without the connecting electrodes. [See A. Aviram, *Molecular Crystals and Liquid Crystals*, 1993, 234, 13.]

Figure 3:
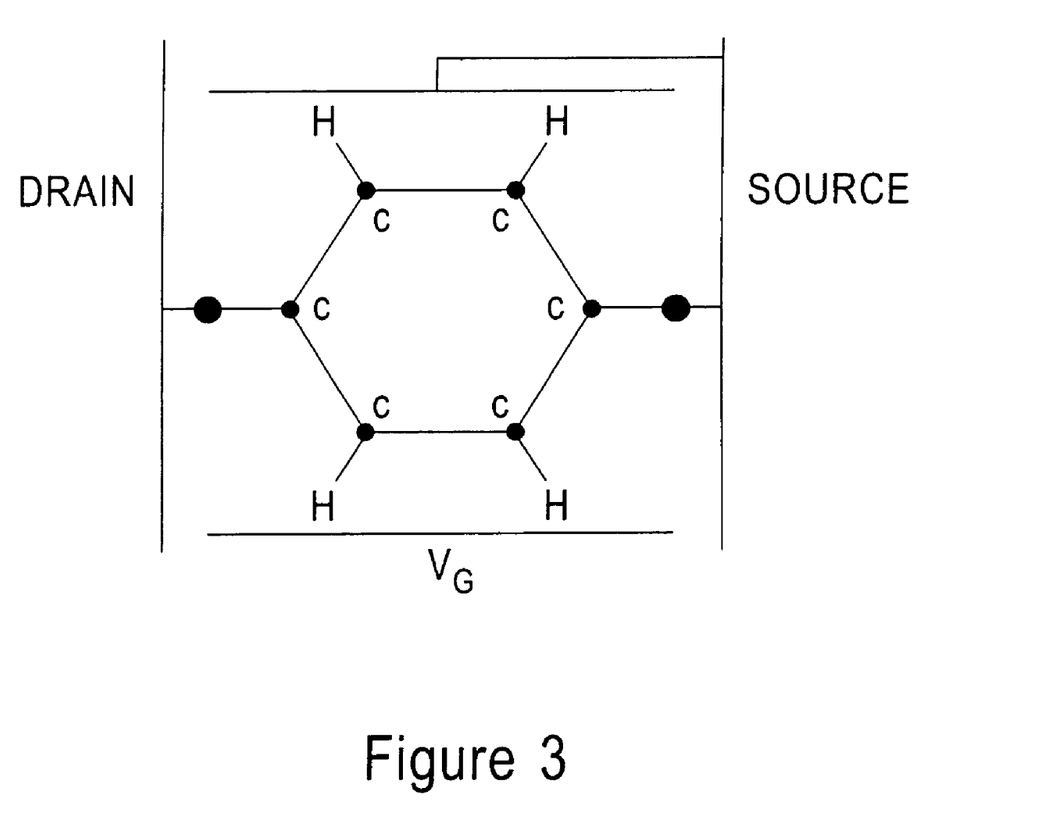
FIG. 3 depicts a molecular transistor based on the model described in Reference 3, further illustrating the electrode connections for the transistor in question.
Figure 4:
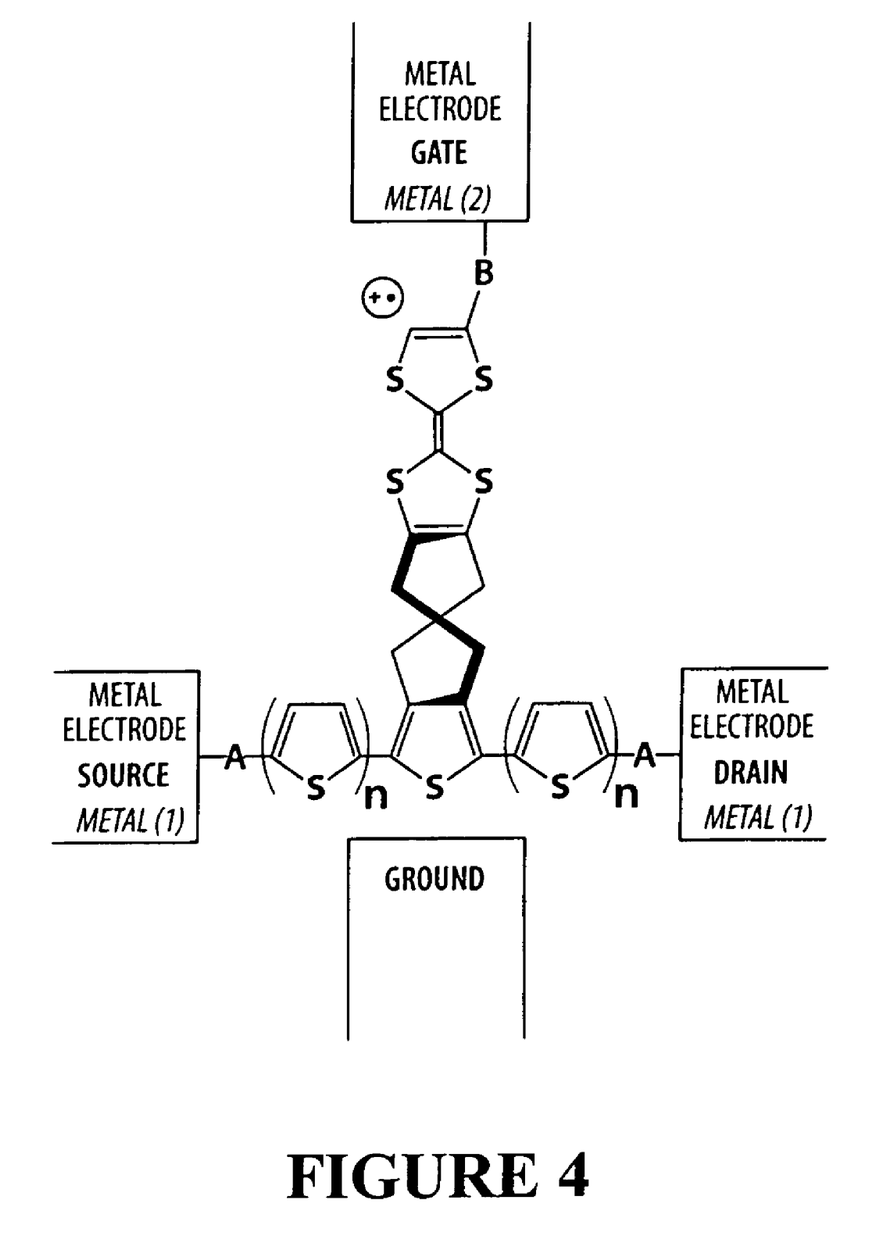
FIG. 4 depicts the electrode arrangement for wiring a molecular transistor belonging to the class shown in FIG. 2, and further illustrating the source/drain electrodes as "Metal 1" connected to the molecule by the same kind of alligator clip. "A", and the gate electrode as "Metal 2," connected to the molecule by a different alligator clip. "B".
Figure 5:
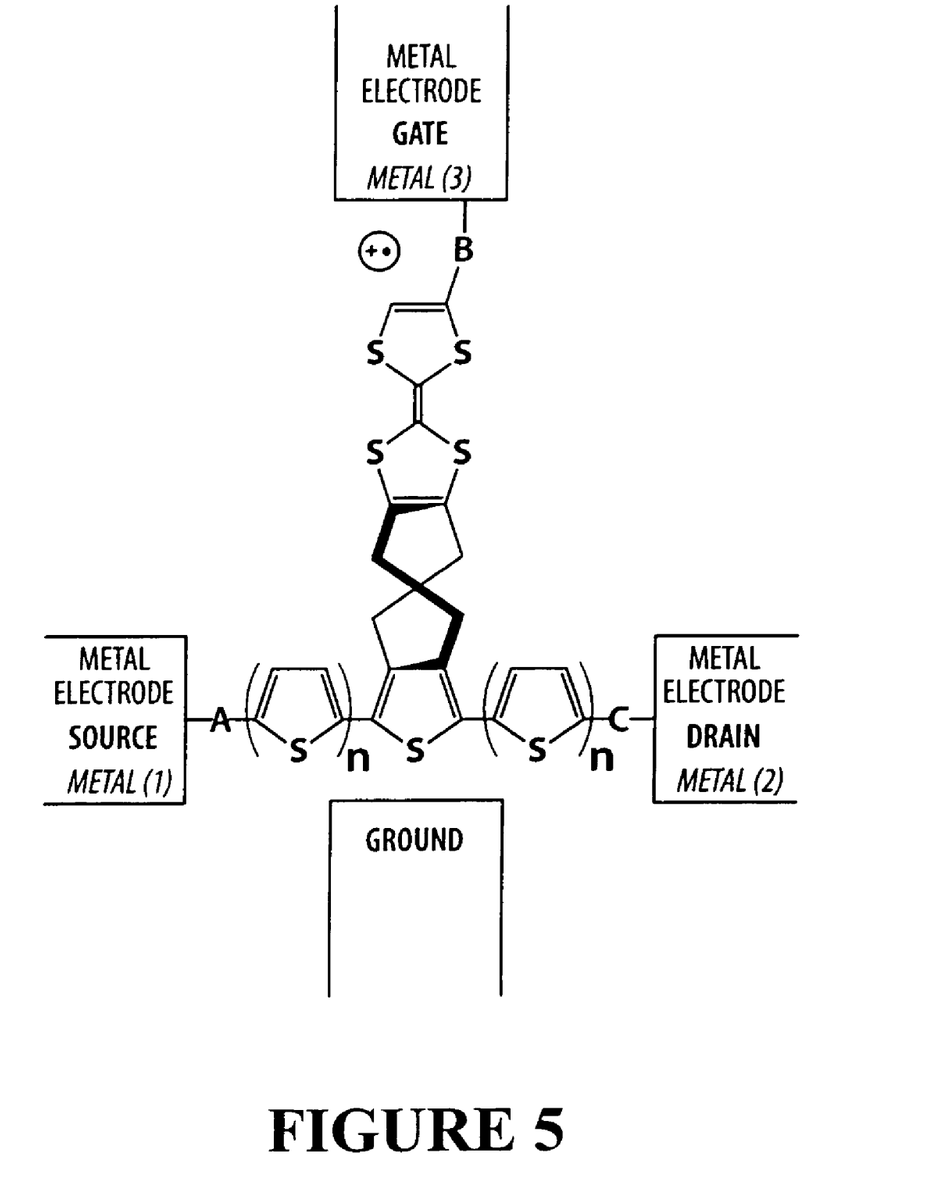
FIG. 5 depicts the electrode arrangement for wiring molecular transistors which require a distinction between the source metal ("Metal 1"), connected to the molecule by an alligator clip, "A", and the drain metal ("Metal 2"), connected to the molecule by another type of alligator clip, "C", as well as the gate metal ("Metal 3"), connected to the molecule by yet a third type of alligator clip, "B".

The second type of molecular transistor of the prior art is categorized as one elongated molecule placed between a total of four electrodes, as shown in FIG. 3. [See M. Di Ventra, S. T. Pentelides, and N. Lang, *Applied Physics Letters*, 2000, 7, 3448.]

In general, the desired migration from semiconductor devices to molecular devices requires the adoption of new techniques and methods from building the molecular-integrated circuits. It is widely accepted that the changeover will utilize the unique technique of self-assembly. [See R. G. Nuzzo and D. L. Allara, *Journal Of The American Chemical Society*, 1983, 105, 4481; D. L. Allara et al., *Annals of the New York Academy of Sciences*, A. Aviram and M. A. Ratner, Editors, 1998, 852, 349.] Importantly, this technique is based on the fact that certain chemical groups have a strong affinity for specific metal surfaces, and will therefore form strong chemical bonds therewith.

To provide an example of the above, the sulfur group (—SH) generally binds spontaneously to gold, platinum, silver, and copper. This allows same to form single monolayers of the organic or organometallic compound on the metal surface. Such method has been successfully used to place molecules between adjacent electrodes and to make electrical contacts to them. [See M. A. Reed, C. Zhou, C. J. Muller, T. P. Burginn and J. M. Tour, *Science*, 1997, 278, 252.]

The binding groups referred to above are called "alligator clips." The first publication proposing the use of self-assembly for molecular-electronic circuits appeared in 1991. [See A. Aviram, *International Journal of Quantum Chemistry*, 1992, 5, 1615.]

The method has since been accepted as the only practical method for making "ohmic" contacts to the molecules. According to this concept, the formation of molecular-electronic circuits is based on the following steps:

Step 1: The molecules are synthesized and provided with alligator clips in the positions where the molecule is intended to be connected to the circuit electrodes;

Step 2: A network of metallic electrodes is prepared on an insulating surface according to the circuit specifications. The network contains gaps in all locations where the molecules will be inserted. The size of the gaps must be a n effective match to the size of the molecules which must be contained in the gap; the metal composition is intended to have an affinity to the alligator-clips on the molecules; and Step 3: The metal network is brought into contact with a solution of the molecules, and self-assembly occurs spontaneously. More particularly, the molecules insert themselves in the appropriate gaps. After such attachment occurs, the unbound molecules are rinsed off. This step effectively completes the circuit formation.

In this context it must be understood that the transistor is the device that made possible the electronic revolution that is in progress today. If molecular electronics is to supplement or exceed the capabilities of the semiconductor industry, there must be a cost-effective and reliable way to wire three-terminal molecular transistors into integrated circuits. The present invention teaches how to achieve this important goal.

As outlined above, the self-assembly technique is employed to direct the molecules to the respective locations in the circuit and to attach them to the electrodes. However, the examples found in the current literature show how to attach molecules to only one or two terminals. Specific examples for simultaneous attachment of molecules to three electrodes do not exist in the prior art.

Because the transistor molecule contains three terminals, there is a significant need for a method to attach all three terminals in the proper order. Specifically, because of the C2v symmetry of the molecules, the source and drain terminals on the molecule are symmetric and interchangeable, while the gate terminal must be connected to a specified gate electrode.

SUMMARY OF THE INVENTION

As noted, the present invention relates to electronic circuits based on molecular transistors, as distinguished from traditional semiconductors. It has been demonstrated that some molecules are useful for building electronic circuits of the types used in integrated circuits, which are currently built from semiconductor devices. Such is particularly the case given the fact that the molecules are highly uniform in nature. The intent of the new field is to modify the prevailing approach for building electronic components and switch over from semiconductor transistors to molecular transistors.

The new field is called Molecular Electronics or "Moletronics," which utilizes chemical reactions to create batches of molecular-scale or nanometer-scale (one billionth of a meter-scale) circuits. As such, it is expected that molecular-electronic devices will become important for the fabrication of pinhead-sized, ultra-dense computer memories, which utilize fractions of the power consumed by conventional semiconductor circuits, at a fraction of the fabrication cost.

Regarding the limitations of the prior art methods, a solution to the challenge outlined in the previous section can be achieved by a clever design of the interconnect metallurgy. By distinguishing between the gate-electrode metal and the metal used for the source and drain electrodes, an opportunity arises to direct the terminals of the molecule to the proper connection arrangement.

This can be accomplished by providing the molecule with specific alligator clips (described above) for binding the source/drain ends of the molecule to the source/drain electrodes, and a different specific alligator clip for binding the gate end of the molecule to the gate electrode. Importantly, these considerations guide the design of the molecules and the design of the metal-electrode patterns.

Figure 2:
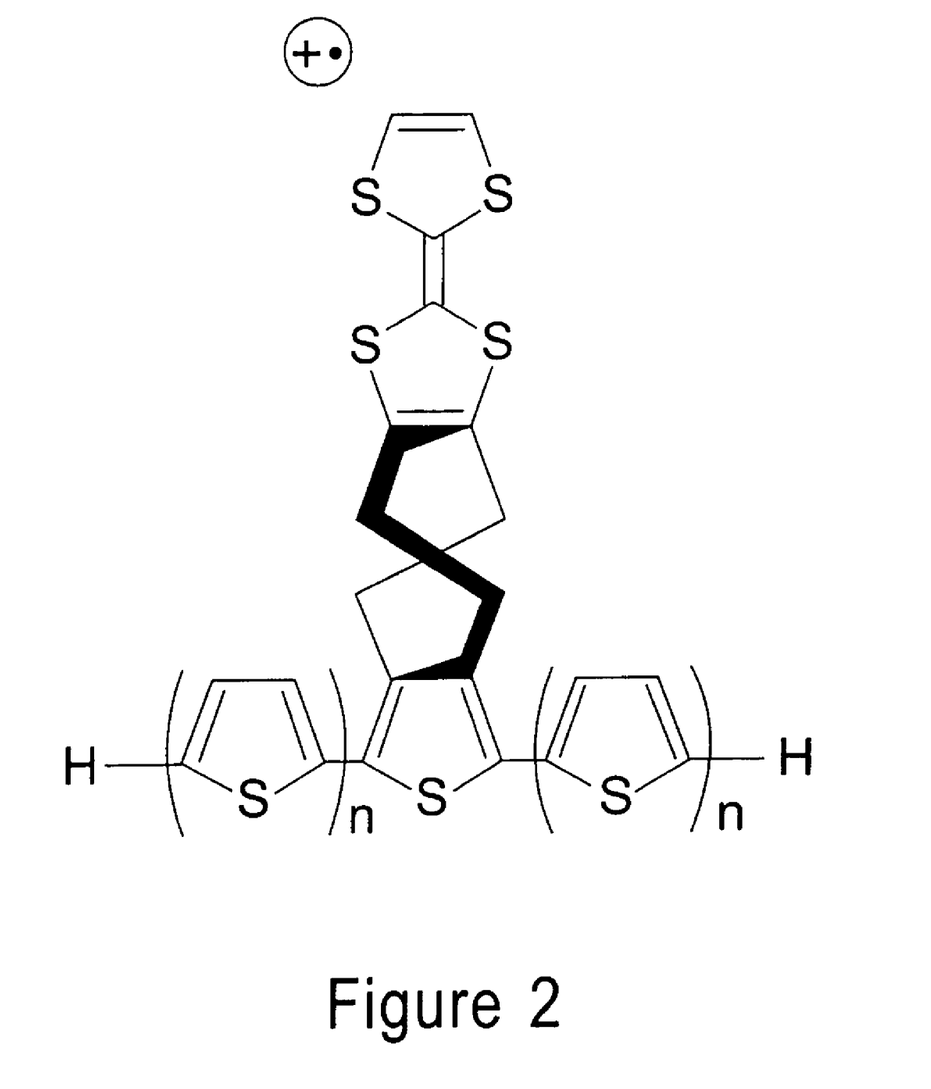
FIG. 2 depicts a molecular transistor based on the mixed-valence model described in Reference 2. This is a planar configuration of the molecule. The figure does not show the electrode connections.

Another important consideration of the present invention is specific to the mixed-valence transistor described in the references relating to FIGS. 1 and 2. For these transistors, it is important to guarantee that all of the molecules in the circuit have the proper mixed-valence structure. This can be achieved by chemical, photochemical, or electrochemical means.

The chemical approach relies on chemical equilibrium, thus measures should be taken to oxidize all of the molecules in the circuit. The photochemical approach is also a viable option, as is the electrochemical.

According to the electrochemical approach, the electrodes that bind the source and drain terminal can be used to perform electrochemistry on the molecules that are bound to their surface. The electrode material for such an operation can be platinum, which is known to perform well in electrochemical processes. Platinum also works effectively in self-assembly, binding to —SH groups as well as gold. However, it is important to note that other metals can be used, provided that such can safely perform the electrochemical process in question.

The above considerations suggest the following viable plan: the circuit is preferably fabricated from one type of metal (denoted as "metal 1" in the FIGURES) for the source and the drain connections, and from another ("metal 2") for the gate connection. The molecules may contain specific alligator clips on the source and drain terminals which can connect to metal 1, and a different alligator clip on the gate terminal which will bind exclusively to metal 2. The molecules are intended to be attached to the three terminals by self-assembly, either as neutral species or as charged species.

Furthermore, cyclovoltametry experiments have shown very well controlled one-or two-electron reductions or oxidations of similar compounds at distinct voltages. [See J. Guai, A. Diaz, R. Wu, and J. M. Tour, *Journal of the American Chemical Society,* 1993, 115, 1869.]

To affect the electrochemical step properly, the source/drain electrodes should be chosen to serve as electrochemical electrodes, in addition to the other outlined considerations. It is important to apply the electrochemical potential, which ensures that only one electron oxidation or reduction, respectively. The described electrochemistry on the chip can ensure that all of the molecules in the circuit may be prepared in mixed-valence state.

Because molecular transistors based on the reference relating to FIG. 3 do not have mixed valence, they do not require oxidation or reduction. In this instance, the alligator clips should be matched to the source/drain electrode metallurgy, and the gate electrode should not have an affinity for the alligator clip.

The above description relates to symmetric molecules in which the source and drain electrodes are made of the same metal. However, it is also conceivable that some molecules will require a specific alignment; namely, the channel segment of the molecule will not be symmetric. As such, there will be a need to connect the drain to a specific drain electrode and the source to another electrode. In such case, each of the tree terminals will have to be connected to electrodes fabricated from metals, tailored to connect to specific alligator clips.

Moreover, the arrangement of the three metal electrodes can be such that all are in one plane. It is also possible to provide a structure with two electrodes in one plane, and the third in a second plane perpendicular thereto.

Therefore, in light of all of the foregoing, it is generally an object of the present invention to provide a method for simultaneous attachment of molecules to three electrodes.

It is also generally an object of the invention to provide for simultaneous attachment of molecules to electrodes in the proper order.

It is a further object of the present invention to provide a rapid and reliable means to attach molecules to electrodes.

It is also a specific object of the invention to provide a method for distinguishing a gate electrode metal from metal used for source and drain electrodes.

It is a further object of the invention to provide a means to direct the terminals of a molecule to the proper connection arrangement.

It is another object of the present invention to provide a highly cost-effective method of fabrication of ultra dense memories with very large storage capacities.

It is a further object of the invention to provide an efficient means to create increased circuit density.

It is also an object of the invention to provide for computing speed significantly greater than that achieved through the technology of the prior art.

It is another object of the present invention to provide for miniaturization of chips and computers such that same can be incorporated into virtually all man-made articles and end-user products.

It is also a specific object of the invention to provide ultra dense memories which utilize fractions of the power typically consumed by traditional semiconductor circuits.

It is another object of the invention to provide for systems which enjoy a fault tolerant architecture.

It is an additional object of the invention to provide a specific method that is suitable for usage in conjunction with mixed-valence transistors.

Relating to the above instance, it is a specific object of the invention to provide a method that utilizes chemical, photochemical, or electrochemical means to insure that molecules in a circuit are of a proper mixed-valence structure.

It is a further object of the invention to provide a method that may be utilized in conjunction with platinum, gold, or a host of other metals.

It is an additional object of the invention to provide a method of arrangement wherein all three metal electrodes are in a single plane.

Finally, as an alternative t the above, it is also an object of the invention to provide a method of arrangement wherein two metal electrodes are in one plane and the third is in a perpendicular plane.

The novel features which are considered characteristic for the invention are set forth in the claims. The invention itself, both as to its construction and its method of operation, together with additional objects and advantages thereof, will be best understood from the following description of the embodiments when read and understood in connection with accompanying drawings.

DETAILED DESCRIPTION OF THE PREFERRED EMBODIMENT

The preferred embodiment of the present invention is further described below in the form of several specific examples. It is important to note that the molecules described in such examples are generic in nature, and do not constitute exclusive embodiment of the invention. The wiring procedures described herein fit all of the molecules that fall within the two general classes represented by FIGS. 2 and 3, respectively, as described above. In addition, the film patterning with nanometer-scale linewidth was accomplished by e-beam lithography using PMMA e-beam resist, followed by metal deposition and liftoff.

EXAMPLE 1

First, a molecule such as that depicted in FIG. 2 can be "wired" as a transistor by distinguishing between the source/drain metallurgy and the gate metallurgy, and by providing the proper alligator clips to direct the molecule toward the proper connection. The alligator clips on the source/drain chain are —SH groups. The alligator clip on the gate chain is a phosphate group. Initially the oxidation state of the molecule is neutral.

A metal-electrode pattern is then provided on an insulating surface with gaps in locations where the molecules belong. Importantly, the size of the gap is tailored to fit the length of the molecule. The metallurgy is chosen according to several considerations, including the following:

The gate electrode is fabricated from aluminum, which couples specifically to the phosphate alligator clip on the molecule (gate chain). The source/drain electrodes are fabricated from platinum in this mode, which couples specifically to the —SH alligator clips on the corresponding chain. The surface containing the electrode pattern is then immersed in a solution containing the molecules. Thus, self-assembly occurs spontaneously.

After attachment of the molecules into the circuit, the surface is immersed in an electrolyte. A positive voltage is then applied sequentially to each of the source electrodes in question. The polarity depends on the initial oxidation state of the molecule in question, which is neutral in this instance, therefore requiring the platinum electrode to be positive. The voltage intensity applied for the electrochemical oxidation is then determined by cyclic voltametry. It is important to keep the oxidation voltage at the first oxidation peak.

EXAMPLE 2

Second, the molecule depicted in FIG. 2 can be prepared in a doubly-oxidized state, with two electrons missing. In this case, the wiring proceeds much in the manner of that described in EXAMPLE 1. However, the electrochemistry step is that of reduction; as a negative voltage is applied.

EXAMPLE 3

Next, the circuit is obtained in the same way as described with regard to EXAMPLE 1, in this instance with photochemical oxidation. The oxidation step is accomplished by following the procedure for assembling the circuit that is described in EXAMPLE 1.

Specifically, the chip is immersed in a concentrated solution containing the molecules shown in FIG. 2, followed by rinsing. Once the molecules are in place, the circuit is preferably immersed in carbon tetrachloride and irradiated with UV radiation. Photochemical oxidation then occurs, and the mixed-valence state is formed.

EXAMPLE 4

Finally, the molecule depicted in FIG. 3 is provided with two —SH terminal groups functioning as alligator clips. An electrode pattern is provided on an insulating surface with gaps in locations where the molecules belong. The metallurgy is preferably chosen as follows: The source/drain electrodes are fabricated from gold. The gate electrodes are fabricated from aluminum. The surface containing the electrode pattern is then immersed in a solution containing the molecules. Therefore, self-assembly once again occurs spontaneously.

The four above examples are representative of the concept of the present invention, describing instances in which the new principles may be utilized. However, with regards to all descriptions and graphics, while the invention has been illustrated and described as embodied, it is not intended to be limited to the details shown, since it will be understood that various omissions, modifications, substitutions and changes in the forms and details of the device illustrated and in its operation can be made by those skilled in the art without departing in any way from the spirit of the invention.

Without further analysis, the foregoing will so fully reveal the gist of the present invention that others can readily adapt it for various applications without omitting features that, from the standpoint of prior art, constitute essential characteristics of the generic or specific aspects of this invention. What is claimed as new and desired to be protected by Letters Patent is set forth in the appended claims.

What is claimed is:

1. A method of forming at least one nanometer-scale circuit comprising a molecular electronic transistor and electrical contacts therefor, the method comprising the steps of:
    wiring a three-terminal molecule comprising a source terminal, a gate terminal, and a drain terminal to serve as a molecular electronic transistor,
    the electronic transistor comprising the molecule attached to a gate electrode, a source electrode, and a drain electrode,
    wherein the source electrode and the drain electrode are fabricated from a first previously-determined metal and the gate electrode is fabricated from a second previously-determined metal;
    functioning to allow for simultaneous attachment of the molecule to the source electrode, drain electrode, and gate electrode in a previously-determined order; and
    allowing the molecule to attach to the source electrode, the drain electrode, and the gate electrode in the previously-determined order, thereby forming the nanometer-scale circuit, wherein the circuit comprises a molecular electronic transistor and electrical contacts therefor.

2. The method of claim 1, for forming at least one nanometer-scale circuit, wherein the method is utilized in conjunction with mixed-valence transistors.

3. The method of claim 2, for forming at least one nanometer-scale circuit, wherein the method utilizes a chemical means.

4. The method of claim 2, for forming at least one nanometer-scale circuit, wherein the method utilizes a photochemical means.

5. The method of claim 2, for forming at least one nanometer-scale circuit, wherein the method utilizes an electrochemical means.

6. The method of claim 1, for forming at least one nanometer-scale circuit, wherein the method is utilized in conjunction with the source electrode the drain electrode, and the gate electrode existing in one plane.

7. The method of claim 1, for forming at least one nanometer-scale circuit, wherein the method is utilized in conjunction with two electrodes in one plane, and a third electrode in plane perpendicular thereto.

8. The method of claim 7, for forming at least one nanometer-scale circuit, wherein the method is utilized in conjunction with the source electrode and the drain electrode in one plane, and the gate electrode in a plane perpendicular thereto.

9. The method of claim 8, for forming at least one nanometer-scale circuit, wherein the molecule comprises specific alligator clips on the source terminal and the drain terminal which can connect to the first previously-determined metal, and further comprises a distinct alligator clip on the gate terminal which binds exclusively to the second previously-determined metal.

10. The method of claim 9, for forming at least one nanometer-scale circuit, wherein the molecule is attached to the source electrode the drain electrode, and the gate electrode by self-assembly as a neutral species.

11. The method of claim 9, for forming at least one nanometer-scale circuit, wherein the molecule is attached to the source electrode the drain electrode, and the gate electrode by self-assembly as a charged species.

12. The method of claim 1, for forming at least one nanometer-scale circuit, wherein the gate electrode is of a material selected from the group consisting of titanium, chrome, nickel, polysilicon, silicon, aluminum, tinoxide indium, tinoxide, and gallium arsenide.

13. The method of claim 1, for forming at least one nanometer-scale circuit, wherein the first previously-determined metal is selected from the group consisting of platinum, rhodium, silver, gold, and copper.

14. A method of forming at least one nanometer-scale circuit comprising a molecular electronic transistor and electrical contacts therefor, the method comprising:
    wiring a molecule comprising a source/drain chain and a gate chain as a transistor by distinguishing between a source/drain metallurgy and a gate metallurgy, and by providing previously-determined alligator clips which function to direct the molecule toward a proper connection,
    wherein the alligator clips on the source/drain chain are—SH groups, and the alligator clip on the gate chain is a group that specifically attaches to a gate electrode, with the proviso that the alligator clip on the gate chain is not an—SH group;
    providing a metal-electrode pattern comprising a source electrode, a drain electrode, and the gate electrode on an insulating surface with a gap in a previously-determined location in which the molecule belongs,
    wherein the size of the gap is tailored to fit a length of the molecule;
    wherein the gate electrode is fabricated from a metal which couples specifically to the alligator clip on the gate chain, and the source/drain electrodes are fabricated from a metal which couples to the—SH alligator clips on the corresponding chain;
    immersing the surface containing the electrode pattern in a solution containing the molecule, functioning to allow self-assembly to occur spontaneously; and
    allowing the gate electrode to attach to the alligator clip on the gate chain, and the source electrode and the drain electrode to attach to the—SH group alligator clip on the corresponding source/drain chain, thereby forming the nanometer-scale circuit, wherein the circuit comprises a molecular electronic transistor and electrical contacts therefor.

15. The method of claim 14, for forming at least one nanometer-scale circuit, wherein a molecule is prepared in a doubly-oxidized state, with two electrons missing, the method further comprising applying a negative voltage, thereby causing reduction of the molecule.

16. The method of claim 14, for forming at least one nanometer-scale circuit, further comprising immersing the circuit in carbon tetrachloride, and irradiating the molecule with UV radiation to photochemically oxidize the molecule to form a mixed-valence state.

17. The method of claim 14, for forming at least one nanometer-scale circuit, wherein the source/drain electrodes are each fabricated from a metal chosen independently from platinum, rhodium, silver, gold, and copper; and the gate electrode is fabricated from a metal chosen from titanium, chrome, nickel, polysilicon, silicon, aluminum, tinoxide indium, tinoxide, and gallium arsenide.

18. A method of forming at least one nanometer-scale circuit comprising a molecular electronic transistor and electrical contacts therefor, the method comprising the steps of:
  wiring a three-terminal molecule to serve as a molecular electronic transistor,
  the electronic transistor comprising the molecule attached to a gate electrode, a source electrode, and a drain electrode,
  wherein the source electrode is fabricated from a first previously-determined metal; the gate electrode is fabricated from a second previously-determined metal; and the drain electrode is fabricated from a third previously-determined metal; and
  functioning to allow for simultaneous attachment of the molecule to the source electrode, the drain electrode, and the gate electrode in a previously-determined order; and
  allowing the molecule to attach to the source electrode, the drain electrode, and the gate electrode in the previously-determined order, thereby forming the nanometer-scale circuit, wherein the circuit comprises a molecular electronic transistor and electrical contacts therefor.

19. A nanometer-scale circuit comprising a molecular electronic transistor and electrical contacts therefor, produced by the method of claim 1.

20. A nanometer-scale circuit arranged to function as a molecular electronic transistor, the circuit comprising:
  a three terminal molecule comprising a source/drain chain having a source terminal specifically attached to a source electrode; a drain terminal specifically attached to a drain electrode; and a gate chain having a gate terminal specifically attached to a gate electrode;
  wherein the source electrode and the drain electrode are fabricated from a first previously-determined metal and the gate electrode is fabricated from a second previously-determined metal.

21. The nanometer-scale circuit of claim 20, wherein the three terminal molecule is a double-well potential molecule.

* * * * *